(12) United States Patent
Soenen et al.

(10) Patent No.: US 10,700,490 B2
(45) Date of Patent: Jun. 30, 2020

(54) PSEUDO-BALANCED DRIVER

(71) Applicants: UNIVERSITEIT GENT, Ghent (BE); IMEC VZW, Leuven (BE)

(72) Inventors: Wouter Soenen, Heusden (BE); Xin Yin, Sint-Denijs-Westrem (BE)

(73) Assignees: UNIVERSITEIT GENT, Ghent (BE); IMEC VZW, Leuven (BE)

( * ) Notice: Subject to any disclaimer, the term of this patent is extended or adjusted under 35 U.S.C. 154(b) by 38 days.

(21) Appl. No.: 16/312,738

(22) PCT Filed: Jun. 30, 2017

(86) PCT No.: PCT/EP2017/066394
§ 371 (c)(1),
(2) Date: Dec. 21, 2018

(87) PCT Pub. No.: WO2018/002370
PCT Pub. Date: Jan. 4, 2018

(65) Prior Publication Data
US 2020/0161829 A1    May 21, 2020

(30) Foreign Application Priority Data
Jun. 30, 2016 (EP) .................................. 16177056

(51) Int. Cl.
*H01S 5/042* (2006.01)
*H01S 3/00* (2006.01)
*H01S 5/00* (2006.01)

(52) U.S. Cl.
CPC .......... *H01S 5/0427* (2013.01); *H01S 3/0085* (2013.01); *H01S 5/0085* (2013.01)

(58) Field of Classification Search
CPC ... H01S 5/0085; H01S 5/00427; H01S 3/0085
See application file for complete search history.

(56) References Cited

U.S. PATENT DOCUMENTS 5,689,460 A    11/1997 Ooishi
7,630,422 B1   12/2009 Ziazadeh et al.
(Continued)

OTHER PUBLICATIONS

European Search Report from EP Application No. 16177056.5, dated Jan. 26, 2017.
(Continued)

*Primary Examiner* — Michael Carter
(74) *Attorney, Agent, or Firm* — Workman Nydegger

(57) ABSTRACT

A driver for driving laser or a modulator comprises a switch block for switching a current to the laser or modulator and a voltage converter comprising a voltage supply node, an input port for connecting a laser or modulator supply voltage and an output port connected to the switch block. The voltage converter comprises a voltage replica block adapted for generating a pre-defined voltage and is adapted for equalizing DC voltages in the driver by using the pre-defined voltage. The pre-defined voltage approximates the threshold voltage drop of a laser when the driver is connected with a laser or approximates the bias voltage over a modulator when connected with a modulator. The driver comprises a balancer comprising a dummy load connected to the switch block adapted for equalizing voltages in the switch block.

11 Claims, 13 Drawing Sheets

(56) References Cited

U.S. PATENT DOCUMENTS

2004/0258114 A1* 12/2004 Murata ............... H01S 5/042
                                                                  372/38.02
2014/0105610 A1    4/2014  Azadeh

OTHER PUBLICATIONS

International Search Report from PCT Application No. PCT/EP2017/066394, dated Nov. 24, 2017.

* cited by examiner

PSEUDO-BALANCED DRIVER

FIELD OF THE INVENTION

The invention relates to the field of drivers for lasers or modulators. More specifically it relates to the field of high-speed drivers for cathode-driven lasers or of high-speed drivers for modulators.

BACKGROUND OF THE INVENTION

A cathode-drive laser driver can be represented in a simplified matter as a current source which can drive a current through a laser. FIG. 1 shows schematically such a back terminated laser driver. High-speed cathode-drive laser drivers are typically implemented with a back termination resistor to move the dominant pole to higher frequencies.

For back-terminated cathode-drive laser drivers the anode voltage of the laser affects the average laser current and needs to be set at a specific value in order to minimize this impact.

The back termination resistor $R_t$ (resistor 11 in FIG. 1) not only reduces the drive efficiency (m) to the laser, but also introduces a DC current path between the supply voltage node of the driver Vdd1 (the voltage at node 121 in FIG. 1) and the anode voltage node of the laser 195 Vdd2 (the voltage at node 191 in FIG. 1).

In the ideal situation the current through the laser only depends on the current from the driver but as there are two supply voltages there is an extra current path between the supply voltage node of the driver Vdd1 and the anode voltage node of the laser Vdd2. This extra current depends on the difference between the supply voltages Vdd1 and Vdd2. The current can be a negative or a positive current, of which the value is hard to predict or control because of the dependence on $R_t$ and on the series resistance of the laser $R_l$ (the laser can be modelled as a voltage source Vlth and a resistor Rl at DC), hence a constraint on the anode voltage arises that minimizes the extra undesired current through the laser.

In typical driver designs Vdd2 is higher than Vdd1 with an amount equal to the threshold voltage drop of the laser (Vlth in FIG. 1). The laser supply voltage is therefore typically 1 to 2 Volt higher. Therefore it is difficult to achieve very low power consumption and this also complicates the external power supply circuitry to power the chip or transceiver module. Laser technology may for example be operated at 3.3 V while transistor technology may typically be operated at 1-2 V.

The graph in FIG. 1 shows the optical power as function of the laser current $I_l$. The graph shows the relation between the modulation current $I_m$, the bias current $I_b$ and the average laser current $\overline{I_l}$.

The relationship between the laser current $I_l$ and the driver current $I_d$ is as follows:

$$I_l = I_d \cdot m + \frac{V_{dd2} - V_{dd1} - V_{lth}}{R_t + R_l}$$

wherein m is the drive efficiency and can be calculated as follows:

$$m = \frac{R_t}{R_t + R_l} < 1$$

and wherein the second term in the equation is the extra current through the laser. When targeting energy efficient ICs for future data center interconnects, it is advantageous that the anode voltage Vdd2 can be lowered as much as possible, thereby pursuing single-supply operation for the laser driver.

SUMMARY OF THE INVENTION

It is an object of embodiments of the present invention to provide a high-speed driver for efficiently driving a cathode-driven laser or a modulator.

The above objective is accomplished by a method and device according to the present invention.

In a first aspect embodiments of the present invention relate to a back-terminated driver for driving a cathode-driven laser or for driving a modulator. The driver comprises:

a switch block for switching a current to either a laser or either a modulator, wherein the laser or modulator is connectable with a current node of the switch block so as to enable current flowing via the current node to the laser or the modulator, a voltage converter comprising a voltage supply node, an input port for connecting a laser or modulator supply voltage node and an output port connected to the switch block, the voltage converter comprising a voltage replica block which is adapted for generating a pre-defined voltage, wherein the voltage converter is adapted for equalizing DC voltages in the driver during operation of the driver by using the pre-defined voltage, wherein the pre-defined voltage approximates a threshold voltage of the laser or a preferred bias voltage over the modulator, a balancer comprising a dummy load connected to the switch block adapted for equalizing voltages in the switch block. This balancer has as purpose to minimize the peak-to-peak switching current through the voltage converter, thereby isolating the dynamics of the voltage converter from the drivers output current/voltage at the current node and thus avoiding a deterioration in high-speed performance of the drivers output current/voltage.

It is an advantage of embodiments of the present invention that the replica voltage generated by the replica block allows equalizing DC voltages in the driver by using the pre-defined voltage. Thereby undesired currents in the switch block can be avoided. When such a driver is used for driving a laser and when the pre-defined voltage is selected such that it approximates the threshold voltage drop of the laser, an undesired DC current flow between the voltage supply node of the laser (Vdd2) and the voltage supply node of the driver (Vdd1) is prevented. It is an advantage of a voltage converter in accordance with embodiments of the present invention that it achieves low-power operation by removing the anode voltage constraint. Additionally, the possibility now arises to choose Vdd2 equal to Vdd1 leveraging an electro-optic laser transmitter utilizing a single supply voltage. This can greatly simplify the external power supply modules accompanied by a decrease in power dissipation. Power dissipation is further reduced because the drive current can maintain its state regardless of the value of the anode voltage Vdd2, resulting in a minimum required drive current when targeting a certain laser current.

It is an advantage of embodiments of the present invention that at the same time these drivers are suitable for driving a single ended load. Therefore differences in the current through the voltage converter caused by switching of the drive current are minimized by the balancer, leading to a better high-speed performance. It is an advantage of embodiments of the present invention that a higher bandwidth can be achieved than in drivers lacking the back termination resistors. It is an advantage of embodiments of the present invention that no external or on-chip bias tee components are required as such components would increase the cost of the driver and would make the driver less compact. It is an advantage of embodiments of the present invention that the output stage is DC coupled. Compared to an AC-coupled configuration a smaller area can be achieved which is advantageous in multi-channel driver arrays with a restriction on the channel pitch.

When a driver in accordance with embodiments of the present invention is used to drive a modulator it is advantageous that by equalizing DC voltages in the driver the replica voltage can be applied as bias voltage over the modulator (i.e. the preferred bias voltage is the bias voltage of the modulator). When such a driver is used to differentially drive a modulator it is an advantage of embodiments of the present invention that the amount of bias tee components can be halved and that a bias current source can be avoided, minimizing the amount of area and power needed to bias the modulator. When such a driver is used to single-endedly drive a modulator it is an advantage of embodiments of the present invention that no bias tee components are required and that a bias current source can be avoided, minimizing the amount of area and power needed to bias the modulator.

In some embodiments according to the present invention the switch block comprises a differential stage and a corresponding first and second back termination resistor, wherein a first output pin of the differential stage is connected to one side of the first back termination resistor at the current node, and wherein a second output pin of the differential stage is connected to one side of the second back termination resistor at a second node, and wherein the other sides of both back termination resistors are electrically connected with a common node, and wherein either a laser or either a modulator is connectable with the current node so as to enable current flowing via the current node through the differential stage.

In some embodiments according to the present invention the voltage converter comprises a voltage converter block comprising a first input node, a second input node, said voltage supply node and said output port, wherein said output port is connected to the common node of the switch block, wherein the voltage replica block comprises said input port and an output port connected to the first input node of the voltage converter block and wherein the voltage converter block is adapted for equalizing the DC voltage at the first input node with the DC voltage at the second input node by controlling the output port.

In some embodiments according to the present invention the second input node of the voltage converter block is connected with the common node of the switch block when the driver is adapted for driving a cathode-driven laser.

In some embodiments according to the present invention the second input node of the voltage converter block is adapted for obtaining the average voltage at the current node of the switch block when the driver is adapted for driving a modulator. In some embodiments according to the present invention the balancer is adapted for equalizing the voltages of the current node and of the second node of the switch block.

In some embodiments according to the present invention the voltage converter block comprises a transistor and an operational amplifier, the operational amplifier comprising a first input node, a second input node, and an output. In some embodiments according to the present invention:
the voltage replica block is connected on one side with the input port of the voltage converter and on the other side with the first input node of the operational amplifier,
the second input node of the operational amplifier is connected with the common node of the switch block in case the driver is adapted for driving a laser,
the second input of the operational amplifier is adapted for obtaining the average voltage at the current node of the switch block in case the driver is adapted for driving a modulator,
the output of the operational amplifier is connected with the gate of the transistor of the voltage converter block,
the transistor of the voltage converter block is connected to the voltage supply node on one side and to the common node of the switch block on the other side.

In some embodiments according to the present invention the voltage converter block comprises an operational amplifier, a current source and a common-mode resistor,
wherein the voltage replica block is connected on one side with the input port of the voltage converter and on the other side with the first input of the operational amplifier,
wherein the second input of the operational amplifier is connected with the common node of the switch block in case the driver is adapted for driving a laser, or wherein the second input of the operational amplifier is adapted for obtaining the average voltage at the current node of the switch block in case the driver is adapted for driving a modulator,
wherein the current source and the common-mode resistor are connected in series and the common-mode resistor is connected between the voltage supply node and the common node of the switch block and the current source between the common node and ground potential and wherein the output of the operational amplifier is connected with the current source so as to control the current through the current source.

It is an advantage of embodiments of the present invention that the voltage drop between the voltage supply node and the common node can be controlled by controlling the current through a current source of the voltage converter.

In some embodiments according to the present invention the voltage converter block is a switch-mode power supply.

It is an advantage of at least some embodiments of the present invention that a more efficient voltage converter block can be realized than in case the converter block is a linear voltage regulator.

In some embodiments according to the present invention the balancer comprises a first and a second input terminal and an output terminal adapted to source current, wherein the first input terminal is connected to current node of the switch block, and wherein the second input terminal is connected to second node of the switch block, and wherein the balancer is adapted to source a current via the output terminal, based on the voltage difference between the first input terminal and the second input terminal, to make the load of the switch block symmetrical.

In some embodiments according to the present invention the voltage replica block is adaptable to a plurality of pre-defined voltages.

It is an advantage that drivers in accordance with at least some embodiments of the present invention can be used to drive a different laser with a different laser threshold voltage drop. The condition therefore being that the voltage replica block can generate a voltage which approximates the laser threshold voltage drop of the laser the driver is driving. In some embodiments of the present invention the voltage replica block may be programmable to a plurality of pre-defined voltages. In embodiments of the present invention the voltage replica block may comprise an input port which allows to modulate the pre-defined voltage. In some embodiments according to the present invention the voltage replica block may comprise a programmable parameter or appropriate temperature dependence to change the copy of the threshold voltage drop. It is thereby an advantage that a better match between the threshold voltage drop of the laser and the voltage over the voltage replica block can be achieved.

In a second aspect embodiments of the present invention relate to an opto-electronics transmitter comprising a back-terminated driver according embodiments of the present invention and a cathode-driven laser, wherein the pre-defined voltage of the voltage replica block approximates the threshold voltage drop of the laser. In embodiments of the present invention the laser 195 is connected between the voltage supply node 191 and the current node 119 with its anode towards the voltage supply node and its cathode towards the current node.

It is an advantage of embodiments of the present invention that the laser supply voltage can be smaller than the sum of the driver supply voltage and the lasers threshold voltage. It is an advantage of embodiments of the present invention that opto-electronics laser transmitters according to the present invention can be operated using a single supply voltage. This simplifies the external power supply modules and results in a decrease in power dissipation. In addition, the drive current can maintain its state despite a change in anode voltage Vdd2, which would not be the case if the drive current would be adapted based on the monitored laser current.

In some embodiments according to the present invention the opto-electronics transmitter comprises a driver according to embodiments of the present invention and a modulator, wherein the top terminal of the modulator is AC-coupled with the second node and wherein the bottom terminal of the modulator is connected with the current node of the switch block, wherein during operation the pre-defined voltage sets the bias voltage of the modulator.

It is an advantage of at least some embodiments of the present invention that the voltage replica block can be used to bias a modulator.

It is an advantage of at least some embodiments of the present invention that they provide an energy efficient driver for driving a laser or a modulator. It is an advantage of at least some embodiments of the present invention that the amount of bias tee components can be reduced or eliminated and that a bias current source can be avoided, minimizing the amount of area and power needed to bias the modulator.

Particular and preferred aspects of the invention are set out in the accompanying independent and dependent claims. Features from the dependent claims may be combined with features of the independent claims and with features of other dependent claims as appropriate and not merely as explicitly set out in the claims. These and other aspects of the invention will be apparent from and elucidated with reference to the embodiment(s) described hereinafter.

In the different drawings, the same reference signs refer to the same or analogous elements.

Figure 15:
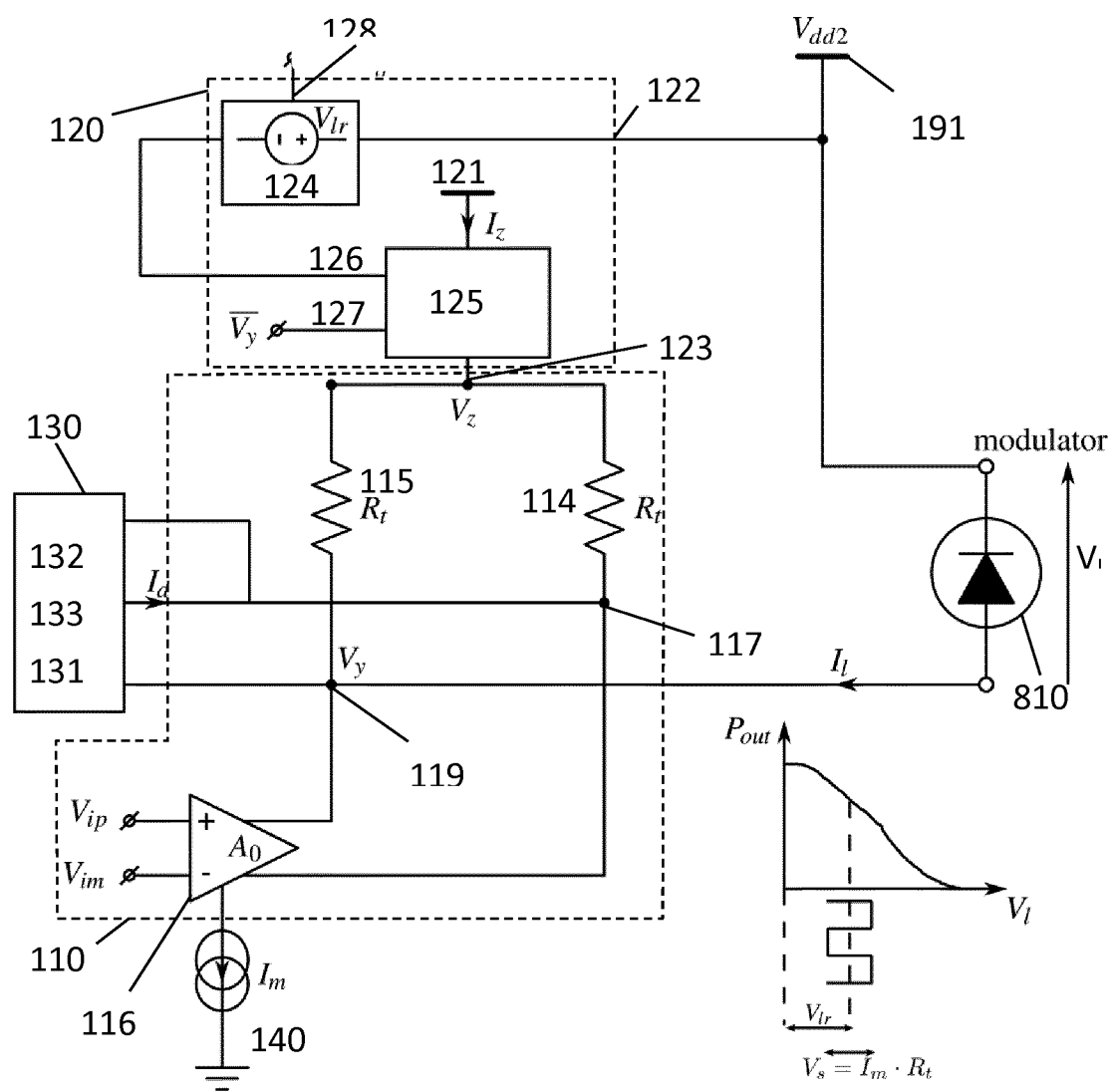
Figure 16:
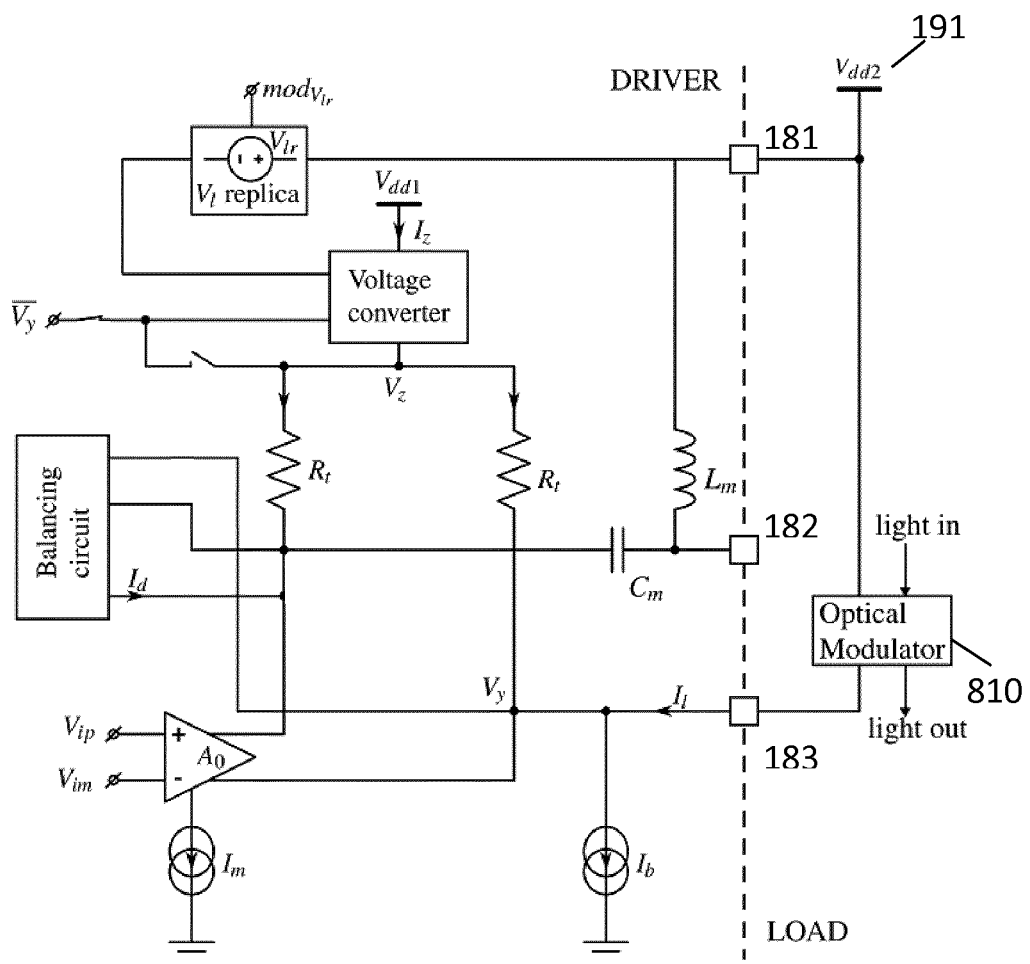

FIG. 15 and FIG. 16 schematically illustrate a driver which is connected with a modulator for single-endedly driving the modulator in accordance with embodiments of the present invention.

Any reference signs in the claims shall not be construed as limiting the scope.

DETAILED DESCRIPTION OF ILLUSTRATIVE EMBODIMENTS

The present invention will be described with respect to particular embodiments and with reference to certain drawings but the invention is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the invention.

The terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

Moreover, the terms top, bottom and the like in the description and the claims are used for descriptive purposes and not necessarily for describing relative positions. It is to be understood that the terms so used are interchangeable under appropriate circumstances and that the embodiments of the invention described herein are capable of operation in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

In the description provided herein, numerous specific details are set forth. However, it is understood that embodiments of the invention may be practiced without these specific details. In other instances, well-known methods, structures and techniques have not been shown in detail in order not to obscure an understanding of this description.

Where in embodiments of the present invention reference is made to "equalizing two voltages", reference is made to enforcing two voltages equal to each other.

In a first aspect, the present invention relates to a back-terminated driver for driving a cathode-driven laser or a modulator. Such a laser may for example be a vertical-cavity surface emitting laser (VCSEL).

Drivers according to embodiments of the present invention are comprising a voltage converter 120. The voltage converter comprises a voltage replica block 124 and a voltage converter block 125.

In embodiments of the present invention the voltage converter 120 tracks the anode voltage and threshold voltage drop of a laser 195 by insertion of a voltage replica block 124 in the feedback loop that connects directly to the anode voltage node 191. Purpose of the dual voltage tracking is to make the current $I_l$ through the laser 195 independent of variations on the lasers anode voltage and forward voltage.

This configuration cancels the current flow $I_{extra}$ between the laser supply voltage node 191 (voltage Vdd2) and the voltage supply node 121 (voltage Vdd1) of the voltage converter. It allows lowering Vdd2 smaller than Vdd1+Vlth wherein Vlth is the threshold voltage of the laser which is explained in FIG. 3. In order to isolate the slow dynamics of the voltage converter block 125 from the high-speed laser current, it is necessary to reduce the swing of the transient current through the converter block 125 as much as possible. Therefore a balancer 130 is introduced in accordance with embodiments of the present invention.

Figure 1:
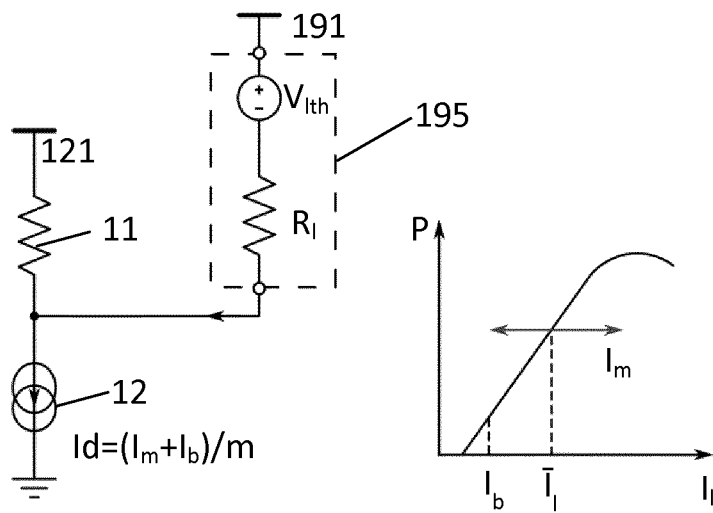
FIG. 1 shows schematically a back terminated cathode-drive laser driver, as known from prior art.
Figure 2:
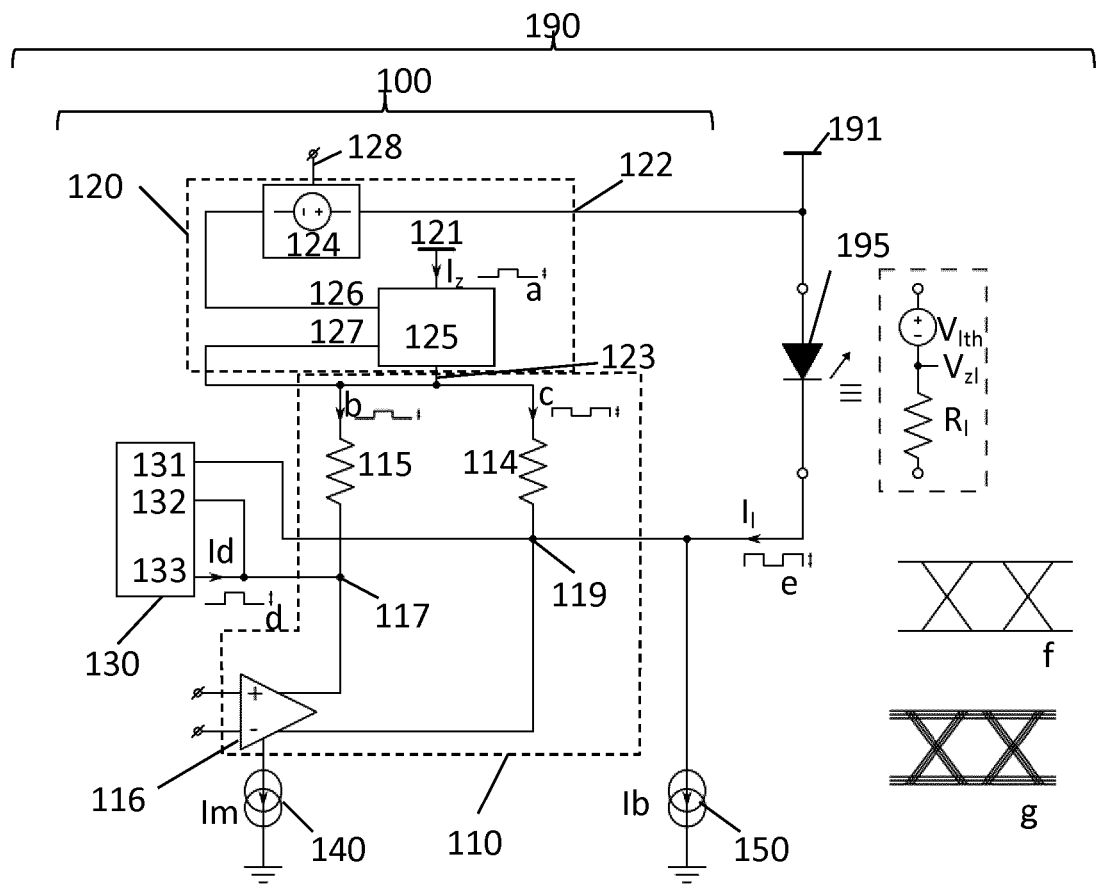
FIG. 2 shows an opto-electronics transmitter comprising a driver which is driving a cathode-driven laser in accordance with embodiments of the present invention.

In the example of FIG. 2 the voltage converter 120 is adapted to match the voltage at the common node 123 of the switch block 110 with the laser voltage Vzl. This allows lowering the power consumption of the driver. The advantage of the voltage converter in this configuration is that the extra current between Vdd2 and Vdd1 which is equal to $$\frac{V_{dd2} - V_{dd1} - V_{lth}}{R_{t+}R_l}$$

can be eliminated. As the supply voltage Vdd2 can vary under different operating conditions, it is desired that the voltage at the common node 123 of the switch block 110 follows these variations. Besides Vdd2, the threshold voltage drop Vlth of the laser can also slightly change over temperature or from device to device. It is an advantage of embodiments of the present invention that also these changes can be tracked by the voltage replica block 124. In embodiments of the present invention a voltage replica block is inserted between the Vdd2 terminal 191 and the reference voltage terminal (the first input node 126) of the voltage converter block 125.

In embodiments of the present invention the voltage of the voltage replica block 124 voltage can be modified by providing a control input terminal 128 to cover a broad range of laser applications. In embodiments of the present invention the voltage replica block 124 comprises a dedicated control input terminal 128. It is thereby an advantage that this allows interfacing the driver 100 to a broad range of lasers or provide calibration over temperature and after fabrication.

Figure 7:
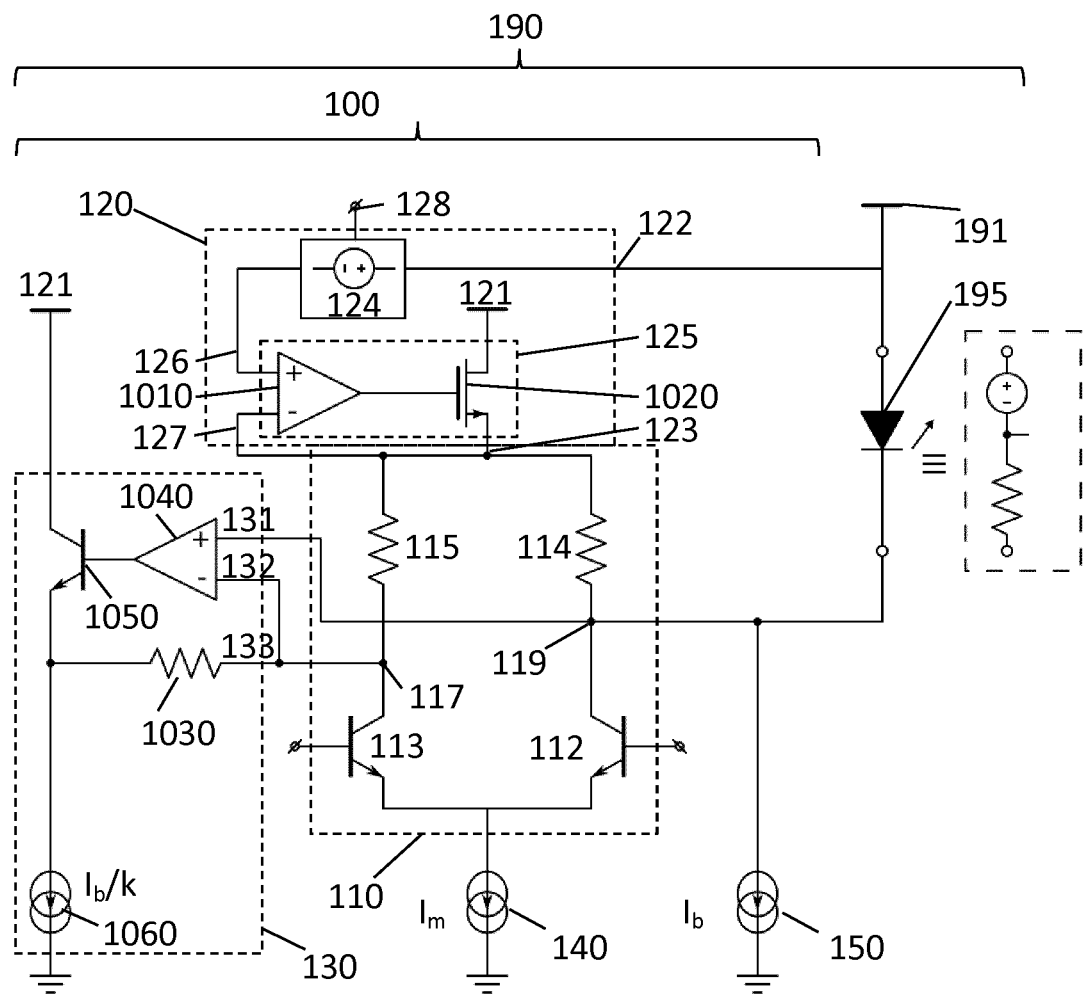
FIG. 7 shows a similar driver as in FIG. 2 illustrating a possible implementation of the voltage converter block and of the balancer in accordance with embodiments of the present invention.

In the exemplary embodiment illustrated in FIG. 2 the voltage converter block 125 will adjust its voltage drop until Vz=Vdd2−Vlr wherein Vlr is the voltage over the voltage replica block 124 and Vz is the voltage at the common node 123 of the switch block 110. The extra current is thereby minimized if Vlr approximates the threshold voltage drop Vlth of the laser. In embodiments of the present invention the voltage converter block 125 can be implemented as a linear regulator or as a switched-mode power supply. An example of a linear regulator is illustrated in FIG. 7.

Figure 3:
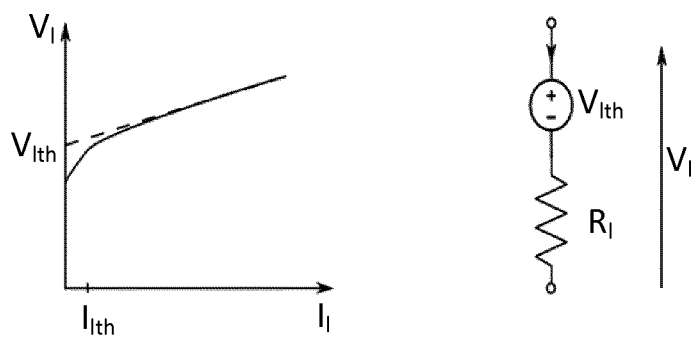
FIG. 3 is a graph showing the forward voltage of a laser in function of the current through the laser.

FIG. 3 is a graph showing the forward voltage of a laser in function of the current through the laser. The forward voltage refers to the total voltage drop over the laser. This also includes the resistive voltage drop from $R_l$.

Where in embodiments according to the present invention reference is made to the threshold voltage drop Vlth, reference is made to the voltage where the laser is starting to emit light. This voltage can be obtained by extracting it from the measured curve via a linear fitted model as shown in FIG. 3. The graph shows the forward voltage in function of the laser current. The dashed line shows the linear fitted model which can be expressed as:

$$V_l = V_{lth} + I_l R_l$$

In embodiments of the present invention the pre-defined voltage of the voltage replica block approximates the threshold voltage drop within a range of +/−5%, or even less. In embodiments of the present invention the voltage converter 120 is adapted for approximating the voltage at the common node 123 to the internal voltage of the laser Vzl (see FIG. 2). In embodiments of the present invention approximating the threshold voltage drop value means reaching it within a range of +/−5%.

When driving a single ended load as in FIG. 2, the voltage converter creates a node voltage Vz at the common node 123 that is lower than Vdd1 (the voltage at the voltage supply node 121).

The extra current between Vdd2 (the laser supply voltage at node 191) and Vdd1 becomes zero when Vdd2 equals the sum of Vlth and Vz and thus allows lowering the anode voltage independent of Vdd1.

In embodiments of the present invention the switch block 110 is a differential pair/driver that implements back termination resistors to target high-speed operation. Low-speed drivers avoiding these back termination resistors do not need the anode and forward voltage tracking loop as there is no undesired current flow between the two supply terminals.

When driving a single ended load as in FIG. 2, but without the presence of the balancer, the transient current Iz through the voltage converter block 125 equals the transient current through the laser due to the asymmetric load and has a peak-to-peak swing of m·Im. The dynamics of the voltage converter block 125 are significantly slower than the differential driver 116. Hence, the settling time of the converter block 125 will distort the eye diagram for patterns with long strings of Consecutive Identical Digits (CID) and results in increased intersymbol interference (ISI), noticeable in graph g of FIG. 2. The ISI leads to a deteriorated eye height and eye width. This introduces a power penalty at the receiver side and makes the design of the Clock and Data Recovery (CDR) less robust.

Therefore drivers according to the present invention are comprising a balancer to preserve the signal quality in the optical link by balancing the output stage. Thereby the output stage is the block that drives the laser. It may comprise the switch block 110, the bias converter 150, and the voltage converter 120. The balancer minimizes the transient current through the voltage converter. In embodiments of the present invention the balancer 130 is a three-terminal control circuit block that senses the voltages of both branches of the differential pair at the current node 119 and at the second node 117, and sources a current Id into the dummy branch to force the voltage at the second node 117 equal to the voltage at the current node 119. Consequently the differential pair sees a symmetrical load at DC. Because it is impossible to perfectly match both impedances, the AC input impedance of the balancing circuit will differ from that of the laser, hence the name 'pseudo-balanced'.

Such a balancer 130 may comprise a dummy load connected to the switch block 110 adapted for enforcing the voltages at the current node 119 and at the second node 117 equal to each other, with the primary purpose to minimize the peak-to-peak switching current through voltage converter block 125, thereby isolating the dynamics of the voltage converter block 125 from the drivers output current/voltage e and thus avoiding a deterioration in high-speed performance of the drivers output current/voltage e (visually explained by graphs f and g in FIG. 2; graph f showing the undistorted eye diagram and graph g showing the deteriorated eye diagram).

It is an advantage of balancer 130 according to the present invention that they can also improve high-speed performance in back terminated differential drivers without integrated voltage converter since an asymmetric load can result in non-linear effects such as a pulse-width distorted output current.

The drive efficiency to the dummy load will also deviate from m and is therefore referred to as m'. Without the balancer, the peak-to-peak transient current Iz through the voltage converter block 125, is equal to (m·Im). It is an advantage of embodiments of the present invention that by introducing the balancer the value of the peak-to-peak transient current Iz through the voltage converter block 125 is reduced with a factor (1−m'/m). In the ideal case where m'=m, Iz remains at a constant level resulting in a laser current $I_l$ free from ISI introduced by settling time effects, as can be observed in the eye diagram f, illustrated in FIG. 2. In FIG. 2 the following peak-to-peak transient currents and the following base currents apply:

For signal a: m·Im·(1−m'/m); (2−m−m')·Ib+(1−m)·Im
For signal b: (1−m')·Im; (1−m')·Ib
For signal c: (1−m)·Im; (1−m)·Ib
For signal d: m'·Im; −(1−m')·Ib
For signal e: m·Im; m·Ib In the example of FIG. 4, the first transistor 112 and the second transistor 113 together with the first back termination resistor 114 and the second back termination resistor 115 constitute the differential pair switching a current $I_m$ to the single-ended laser. In embodiments according to the present invention the modulation current source $I_m$ (140) can be replaced with a resistor to further lower Vtail and increase the headroom of the first and second transistor 112, 113 if necessary. Current source $I_b$ (150) can also be omitted if no constant biasing of the laser is required.

In embodiments of the present invention a common-mode feedback loop may be added in the preceding stage to set Vtail to increase the headroom of the first and second transistor 112, 113.

Figure 4:
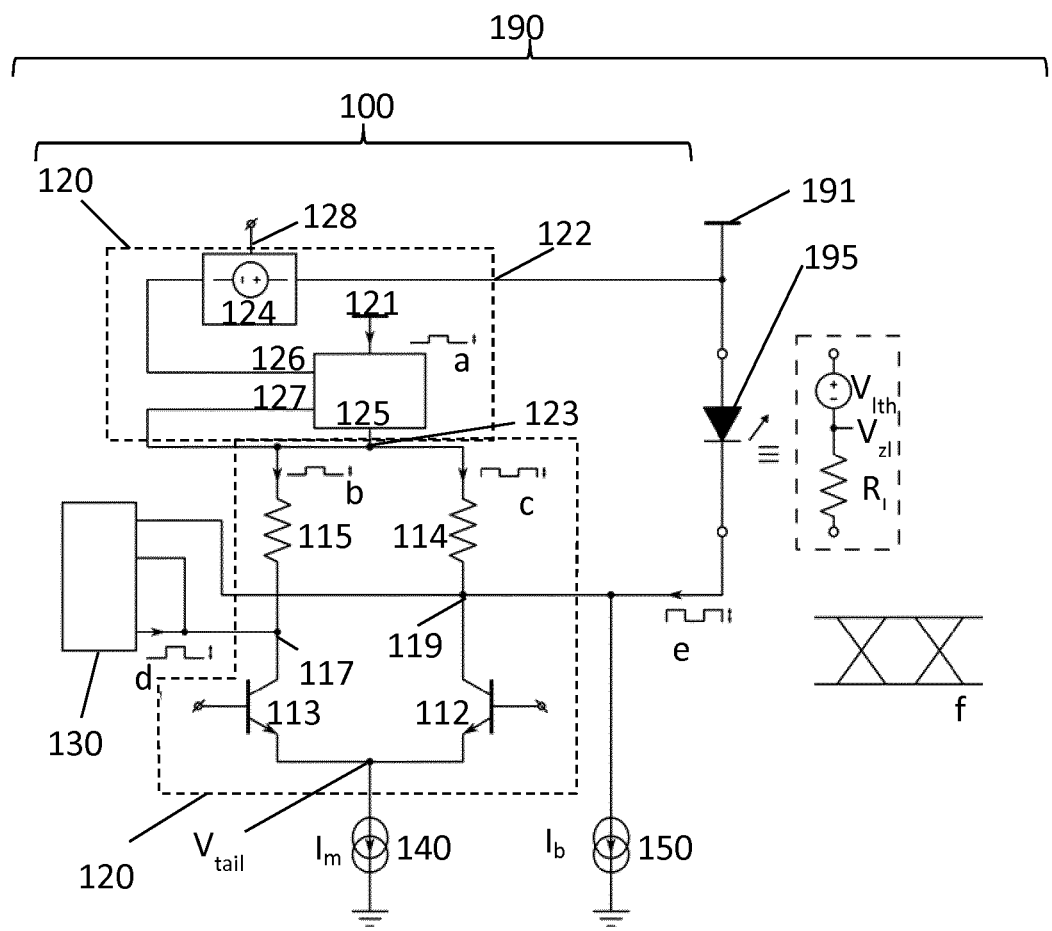
FIG. 4 shows a similar driver as in FIG. 2 wherein the switch block comprises a transistor pair in accordance with embodiments of the present invention.

For FIG. 4 the same signal levels apply as for FIG. 2. Also the same eye diagram can be obtained.

In embodiments of the present invention, such as illustrated in FIG. 4, the voltage at the common node 123 may be equalized with the voltage at the first input node 126. In that case the voltage at the common node 123 will approximate the node voltage Vzl inside the laser. The voltage at the current node 119 equals Vzl minus a voltage drop across laser resistor Rl.

Figure 5:
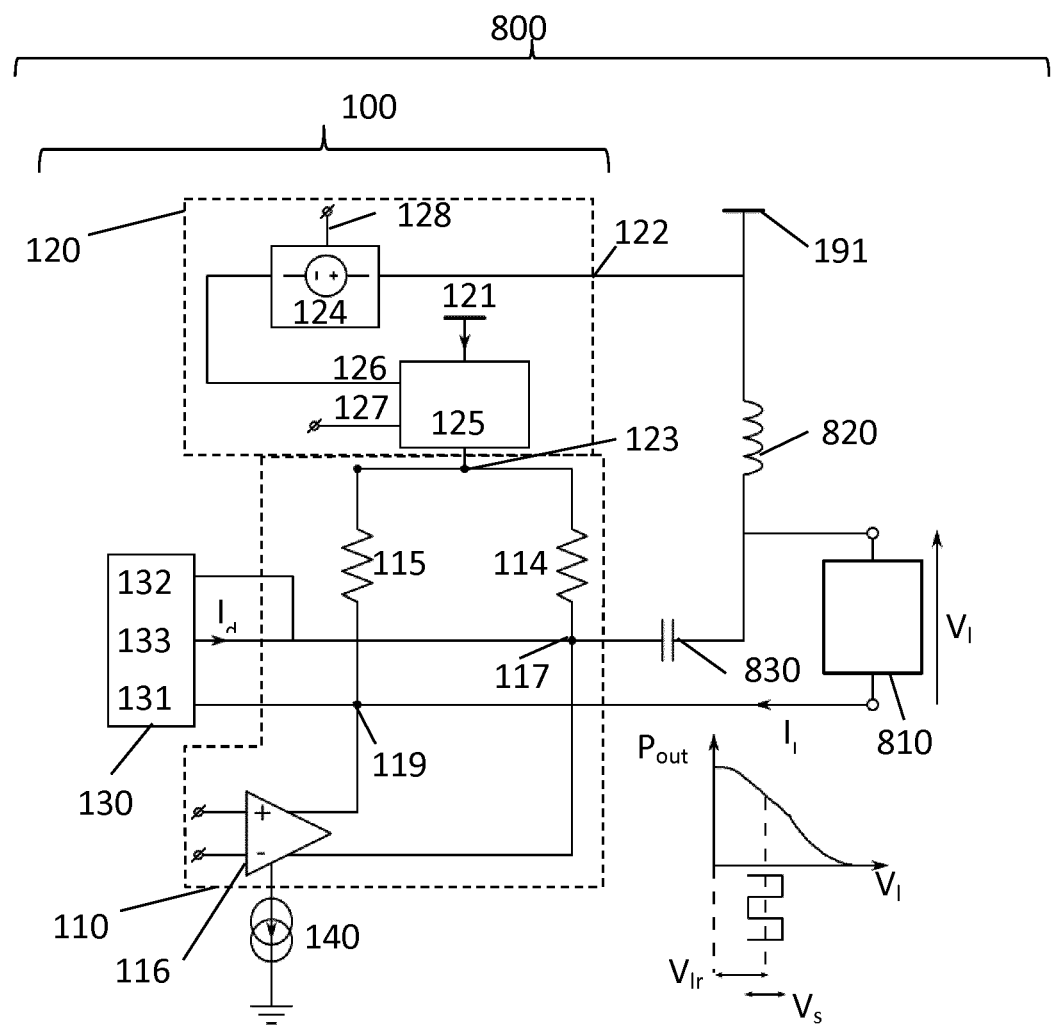
FIG. 5 shows an opto-electronics transmitter comprising a driver which is driving a modulator in accordance with embodiments of the present invention.

FIG. 5 shows an opto-electronics transmitter 800 comprising a driver 100 and a modulator 810 which can be differentially driven by the driver 100. A modulator typically requires a modulation voltage Vs and a bias voltage to modulate the optical output power.

The modulator can be single-ended DC-coupled to the driver, wherein the bottom terminal is connected to the current node 119 of the switch block 110 and the top terminal to the common node 123 of the switch block, effectively placing the modulator in parallel with resistor 114. Without the presence of a voltage converter, node 123 corresponds to supply node 121. This configuration would however result in an increased power consumption to generate the bias voltage.

The power consumption is reduced by AC-coupling both nodes (the second node 117 and current node 119 of the switch block 110), but this requires two bias voltages and two bias tees. Multiple combinations of these configurations are possible but all suffer from previously mentioned drawbacks.

In embodiments of the present invention the top terminal of the modulator 810 is AC-coupled to the second node 117 of the switch block 110 (e.g. over capacitor 830) while also connected to the modulator supply voltage node 191 and the bottom terminal of the modulator 810 is DC-coupled to the current node 119 of the switch block 110. In the exemplary embodiment of FIG. 5 the top terminal is connected (through e.g. an inductor 820) to the supply voltage Vdd2 (at modulator supply voltage node 191). In this embodiment of the present invention the voltage converter 120 is adapted for equalizing DC voltages in the driver 110 during operation of the driver by using the pre-defined voltage. Therefore the average voltage of the current node 119 of the switch block 110 is used as the second input node 127 of the voltage converter block 125. The advantage thereof is that the replica voltage $V_{lr}$ of the voltage replica block 124 directly sets the bias voltage of the modulator 810. This can be illustrated by the following formulas:

$$\overline{V}_l = Vdd2 - \overline{V}_y$$

$$\overline{V}_y = Vdd2 - V_{lr}$$

wherein $V_y$ is the voltage at the current node 119 of the switch block 110, and wherein $V_l$ is the voltage over the modulator 810. From the two previous formulas it follows that:

$$\overline{V}_l = V_{lr}$$

In embodiments of the present invention the pre-defined voltage of the voltage replica block can approximate the bias voltage within a range of +/−1% or less depending on the gain and the voltage offset in the feedback loop of voltage converter 123.

It is an advantage of this exemplary embodiment of the present invention that this technique only requires one bias tee while still acquiring a precise control of the bias voltage. It is an advantage of this exemplary embodiment that no bias current is needed to generate a bias voltage thereby saving static power.

In the exemplary embodiment illustrated in FIG. 5 a balancer 130 is connected to the switch block 110. The advantage thereof being that if the modulator 810, such as an electroabsorption modulator, sources a current $I_l$ to the driver because of the absorbed photons and if this creates an unbalanced output stage where the voltage Vx at the second node 117 of the switch block differs from the voltage Vy at the current node 119 of the switch block, the balancer will source a current $I_d$ to make the load symmetrical again.

The graph in FIG. 5 shows the output power of the modulator in an arbitrary function of the applied voltage. It shows the bias voltage Vlr and a modulation voltage Vs.

Figure 6:
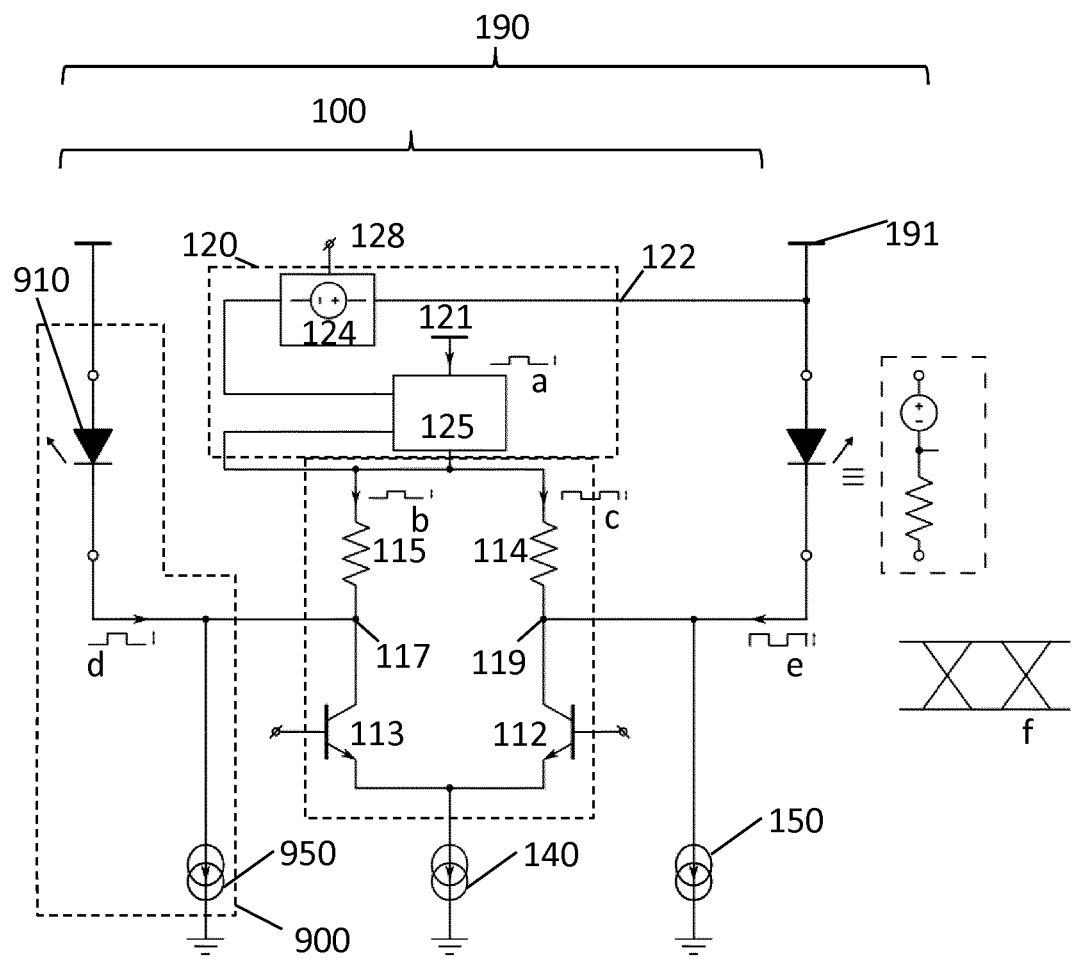
FIG. 6 shows a similar driver as in FIG. 2 wherein the balancer is an identical laser connected to the dummy branch of the differential pair, in accordance with embodiments of the present invention.

FIG. 6 shows a driver in accordance with embodiments of the present invention wherein the balancer is an identical laser connected to the dummy branch of the differential pair. Through current sources 950, 150 the base current Ib is drawn. Through current source 140 the modulation current Im is drawn. For FIG. 6 the same signal levels apply as for FIG. 2, except for the base current of signal d that now equals m'·Ib. Also the same eye diagram can be obtained, although in a less efficient way since an extra laser is necessary of which the optical output is not used.

FIG. 7 shows a driver 100 for driving a laser 195 in accordance with embodiments of the present invention. The driver is similar as the driver in FIG. 2 and FIG. 4. This exemplary embodiment shows a possible implementation of the voltage converter block 125 and of the balancer 130.

The driver 100 is balanced by applying a dummy load to the left branch of the transistor pair 112, 113. The dummy load (i.e. the balancer 130) comprises a first input terminal 131, a second input terminal 132 and an output terminal 133. The balancer moreover comprises an operational amplifier 1040 and a transistor 1050. The first and second input terminal 131, 132 are the inputs of the operational amplifier. The output of the operational amplifier is connected with the gate of the transistor 1050.

The first terminal 131 is connected with the current node 119 of the switch block 110 and the second terminal 132 as well as the output terminal are connected with the second node 117 of the switch block 110. The output terminal is connected over a resistor 1030 with the emitter (source if a FET is used) of the transistor 1050. The collector (drain in case of FET) of the transistor 1050 is connected with the voltage supply node 121.

The operational amplifier 1040 and the transistor 1050 are configured in a feedback loop so as to equalize the voltage of the current node 119 and the voltage of the second node 117 of the switch block.

The current source 1060 is connected with the emitter of the transistor 1050. This current source guarantees a current through the transistor 1050, such that sufficient negative feedback is present under all operating conditions, by adding it up to the base current of signal d which is negative and proportional to Ib and (1−m'). The current source 1060 is a scaled version of the bias current with a scale factor 1/k that should be greater than or equal to (1−m'). Although in practice, this constraint may vary and should be evaluated carefully taking into account all non-idealities.

In embodiments of the present invention the input transistors of the balancing amplifier 1040 are designed small in area in order to limit the added parasitic capacitance at output node Vy (the current node 119). However, reducing the transistor size enlarges the variance over process corners of the offset voltage at the inputs of amplifier 1040. This imposes a slight imbalance between the two branches of the differential pair which translates into a higher transient current through the voltage converter block 125. Typically, the parasitic capacitance introduced by the bias current source Ib and the bond pad dominate the input capacitance of amplifier 1040. If necessary, the input transistors of the amplifier 1040 can still be dimensioned small if the undesired input offset voltage is trimmed or calibrated post-production.

The voltage converter block 125, in the example of FIG. 7 is a linear voltage regulator. It comprises an operational amplifier 1010 and a transistor 1020. The voltage replica block 124 is connected with the first input of the operational amplifier 126. The second input 127 of the operational amplifier 1010 is connected with the common node 123 of the switch block 110. The output of the operational amplifier 1010 is connected with the gate of the transistor 1020 of the voltage converter block 125. The transistor 1020 of the voltage converter block 125 is connected to the voltage supply node 121 on one side and to the common node 123 of the switch block 110 on the other side.

In embodiments according to the present invention the transistor 1020 can be replaced with a current source controlled by the operational amplifier 1010, creating a voltage drop across a common-mode resistor connected between Vdd1 (voltage supply node 121) and Vz (common node 123).

In embodiments according to the present invention the converter block 125 may also be a switched-mode power supply.

The transistors present in a driver, in accordance with embodiments of the present invention, can be MOSFET and/or BJT depending on technology and available headroom.

Multiple differential pairs can connect to nodes Vx (117) and Vy (119) to enable feed-forward equalization topologies or multi-level modulation.

Figure 8:
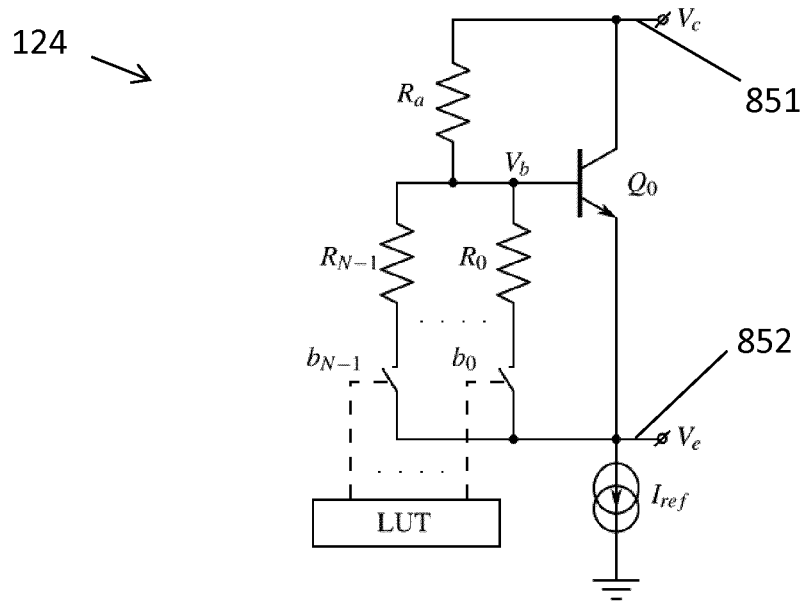
FIG. 8 shows a programmable voltage replica block, more specifically a programmable Vbe multiplier, in accordance with an exemplary embodiment of the present invention.

FIG. 8 shows a voltage replica block 124 in accordance with an exemplary embodiment of the present invention. In embodiments of the present invention the input 851 and the output 852 of the voltage replica block are floating terminals over which a voltage drop is created. Preferably, the voltage drop can be made programmable and/or follow a certain temperature dependence. A possible implementation is a programmable Vbe-multiplier using bipolar junction transistors as shown in FIG. 8. The voltage drop of the replica circuit equals Vce (the collector-emitter voltage) and its expression is stated below. Assuming that the current gain factor β of the transistor Q0 is infinite (no current is flowing into the base of the transistor), Vce solely depends on the base-emitter voltage of the transistor Vbe and the resistor ratio. With this topology, Vce is lower bounded to Vbe and upper bounded to the breakdown voltage of transistor Q0.

$$V_{ce} = V_{be} \cdot \left(1 + \frac{R_a}{R_b}\right)\bigg|_{\beta=\infty} = V_{be} \cdot \left(1 + R_a \cdot \sum_{i=0}^{N-1} \frac{1}{b_i \cdot R_i}\right)\bigg|_{\beta=\infty}$$

The voltage drop Vce can be made programmable by inserting switches in series with resistors $R_0$ to $R_{N-1}$, controlled with bits $b_0$ to $b_{N-1}$. These bits can be derived from a lookup table (LUT) that e.g. relates the bit word to the ambient temperature to track the lasers temperature dependence. The LUT can also store bit words related to types of lasers with a different threshold voltage.

Figure 9:
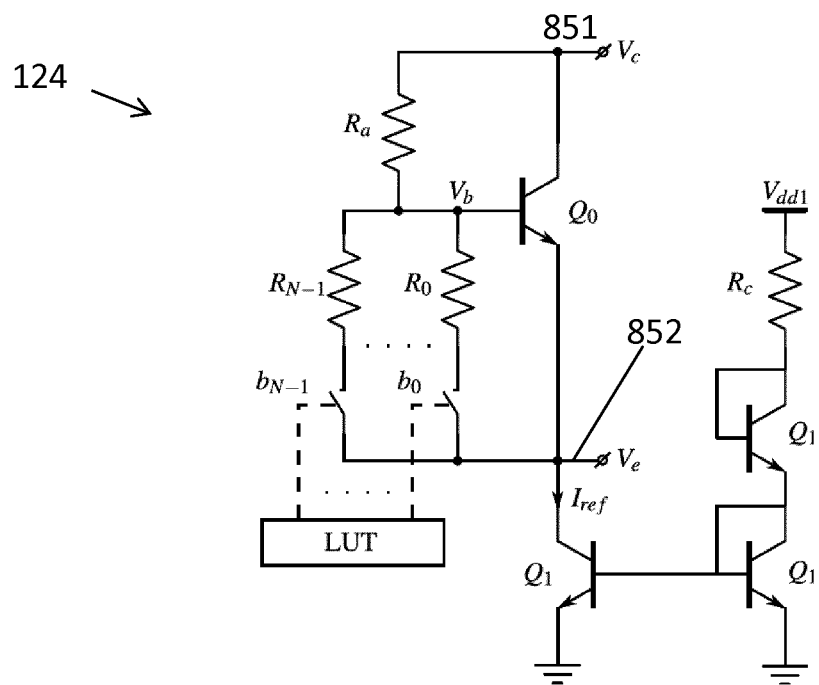
FIG. 9 shows a programmable voltage replica block comprising current source with positive temperature coefficient, in accordance with an exemplary embodiment of the present invention.

In embodiments according to the present invention the lasers temperature dependence can also be tracked by the intrinsic characteristics of the replica circuit itself. Bipolar junction transistors are characterized by a Vbe that has a temperature coefficient (TC) of approximately −2 mV/K. This makes the TC of the Vbe multiplier equal to (1+Ra/Rb)*(−2 mV/K). This TC can be altered by using a reference current source Iref that has a positive or negative TC since Vbe also depends on the current that flows through the transistor. FIG. 9 shows a programmable voltage replica block 124, more specifically a programmable Vbe multiplier, in accordance with embodiments of the present invention. The current source is in this case a current source with a positive TC. This current source is also referred to as a proportional to absolute temperate (PTAT) current source. Iref can be expressed as:

$$Iref = \frac{Vdd1 - 2 \cdot Vbe}{Rc}$$

Since Vbe decreases with temperature, Iref will therefore rise with temperature and partially counteract the TC of the Vbe multiplier in FIG. 8.

Note that the reference voltage Vbe of the Vbe multiplier is sensitive to process variations, although much less than the gate-source voltage of a FET used in a Vgs multiplier, and perhaps can have a TC that does not match with the TC of the laser.

An alternative is to use a precise and stable voltage generator, such as a bandgap reference, however these circuits don't have two floating terminals since they are typically referenced to ground.

Figure 10:
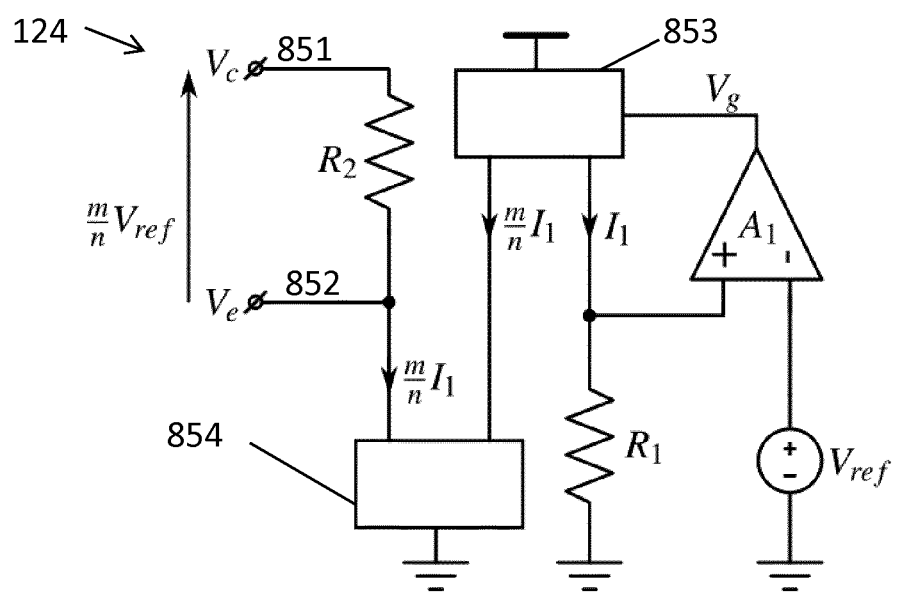
FIG. 10 show a voltage replica block comprising a reference voltage that is isolated from the floating terminals of the voltage replica block.

The voltage replica circuit in FIG. 10 solves this issue by utilizing voltage-to-current conversions in a feedback loop. Amplifier A1 drives control terminal Vg of first current mirror 853 until the voltage across resistor R1 equals the stable reference voltage Vref, thus creating a current I1=Vref/R1. The first current mirror 853 scales I1 with a factor (mirror ratio) m/n, which can be a programmable parameter implemented with bit-controlled switches, while the second current mirror 854 sources the scaled current to a second resistor R2 with a resistance equal to R1. The voltage drop across R2 then equals m/n*Vref and corresponds to the voltage drop Vce. Assuming m/n=1, Vref can be copied to the output within the range of +/−1% as current mirrors and resistors can be designed and layout to match very well.

Note that the scale factor m/n can be distributed between the two current mirrors or included in the resistor ratio R2/R1 and can be made smaller or larger than unity resulting in a Vce smaller or larger than Vref. Compared to the Vbe multiplier, the replica voltage Vce is not upper bounded by e.g. a breakdown voltage.

Figure 11:
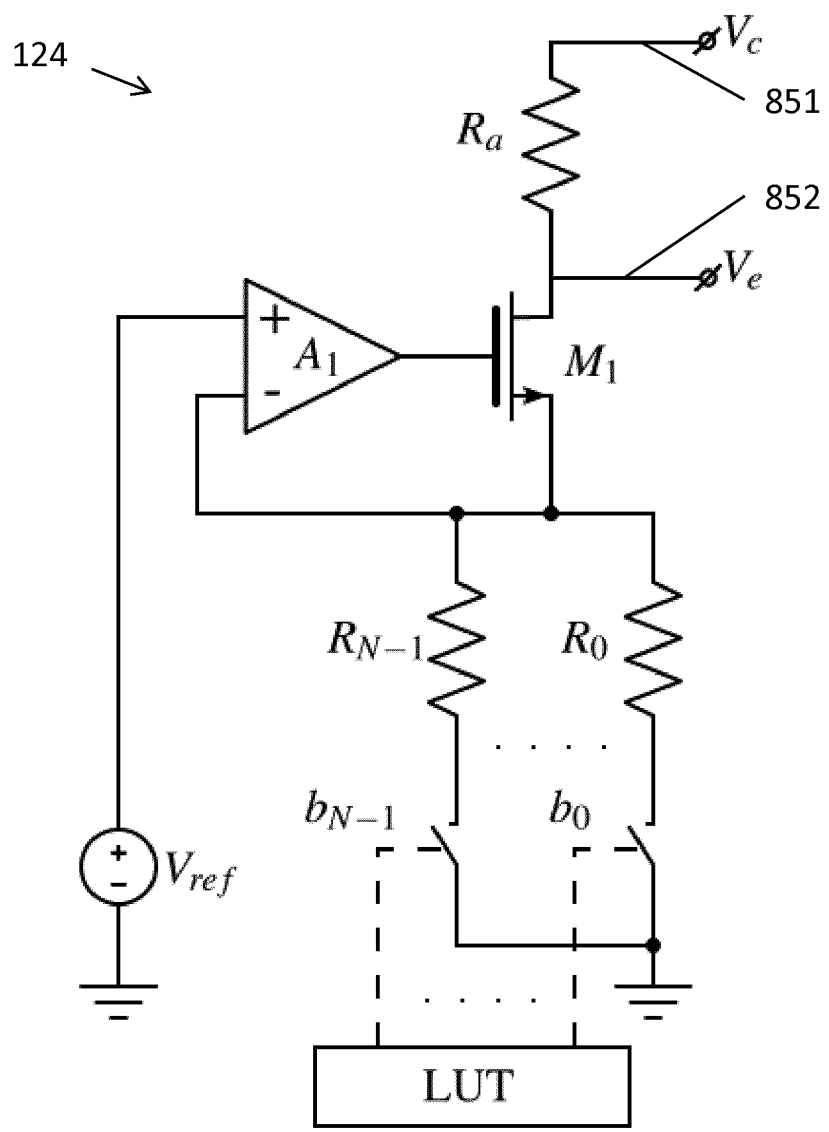
FIG. 11 show a voltage replica block using only the resistor ratio as a scale factor for Vref.

In embodiments according to the present invention the first and second current mirrors 853, 854, as illustrated in FIG. 10, can be avoided by using the topology shown in FIG. 11. In this exemplary embodiment of the present invention amplifier A1 drives transistor M1 until the voltage across the bottom resistor Rb (in FIG. 11 this corresponds with the combination of the parallel resistors in series with the bit controlled switches) equals Vref, thereby generating a current Vref/Rb. This current also flows through resistor Ra, creating a voltage drop equal to Vref*Ra/Rb and corresponds to the voltage replica Vce. Similar to the Vbe multiplier from FIG. 8, resistor Rb can be made programmable by including bit-controlled switches in series with the bottom resistors. This topology will consume less area than the topology from FIG. 10 because the current mirrors 853, 854 are absent. The voltage replica block illustrated in FIG. 10 is, however, less prone to process variations resulting in a scale factor which is less process sensitive.

In summary, it is an advantage of a driver 100 in accordance with embodiments of the present invention that it can provide an accurate and stable biasing of a load while simultaneously minimizing the power consumption. This can moreover be achieved at a high data rate (e.g. 40 Gb/s). It is moreover advantageous that only a minimum of bias tee/RLC interface elements are required for interfacing with the load (examples will be illustrated using FIG. 11, FIG. 12, and FIG. 13). In embodiments of the present invention such a driver may even lead to a single-supply voltage operation of the laser/modulator driver. In embodiments of the present invention the load is either a cathode-driven laser or either a modulator. In both cases, using a driver in accordance with embodiments of the present invention will result in a reduced power consumption.

Power consumption is minimized by firstly reducing waste current through the load, e.g. between the voltage supply Vdd2 at the load supply node 191 and the voltage supply of the driver Vdd1 at the voltage supply node 121, and secondly by making the drive current independent of the load supply voltage Vdd2, thereby simplifying the design of the preceding stage.

Figure 12:
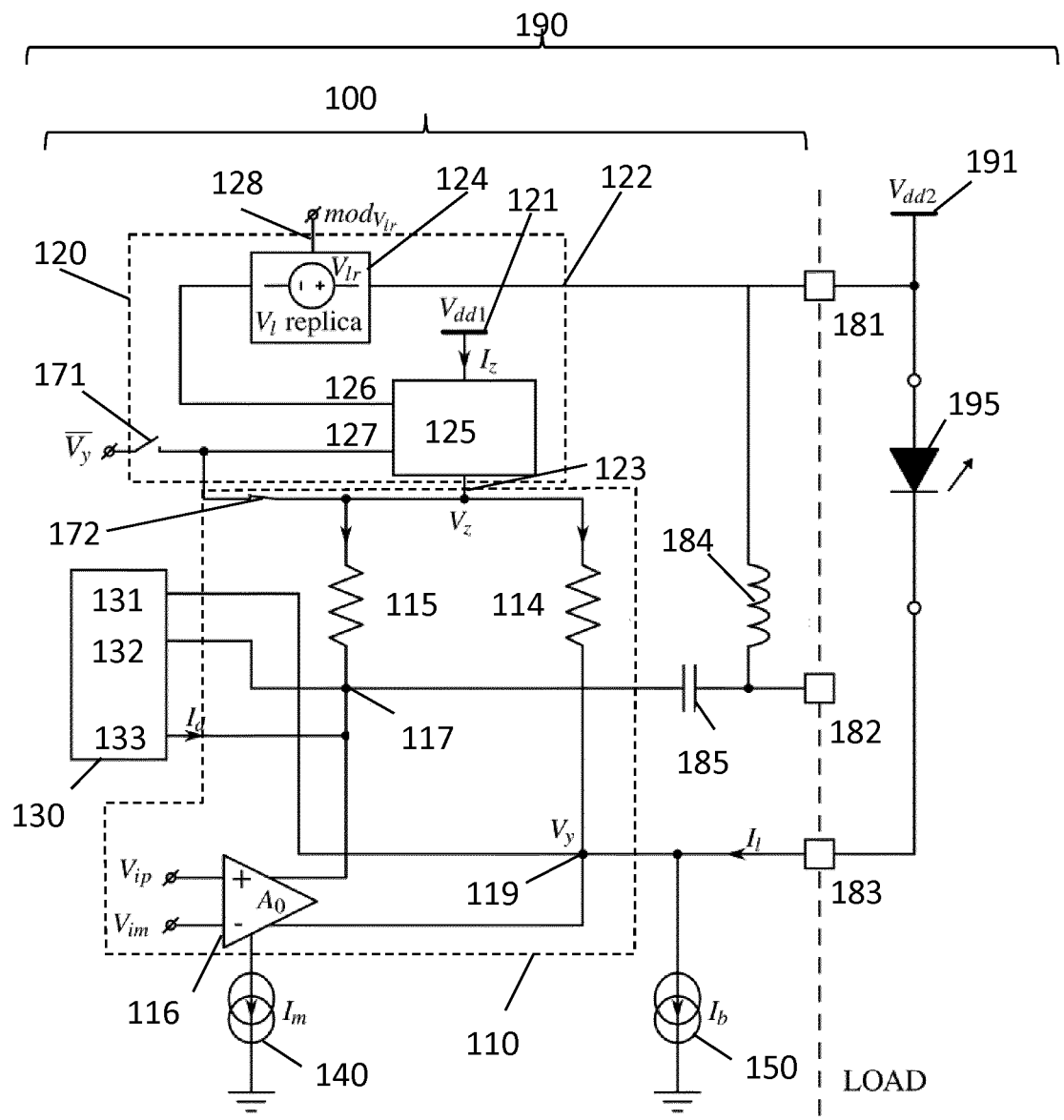
FIG. 12 shows a laser/modulator driver in accordance with embodiments of the present invention wherein the driver is configured and connected with a cathode-driven laser for driving the laser.
Figure 13:
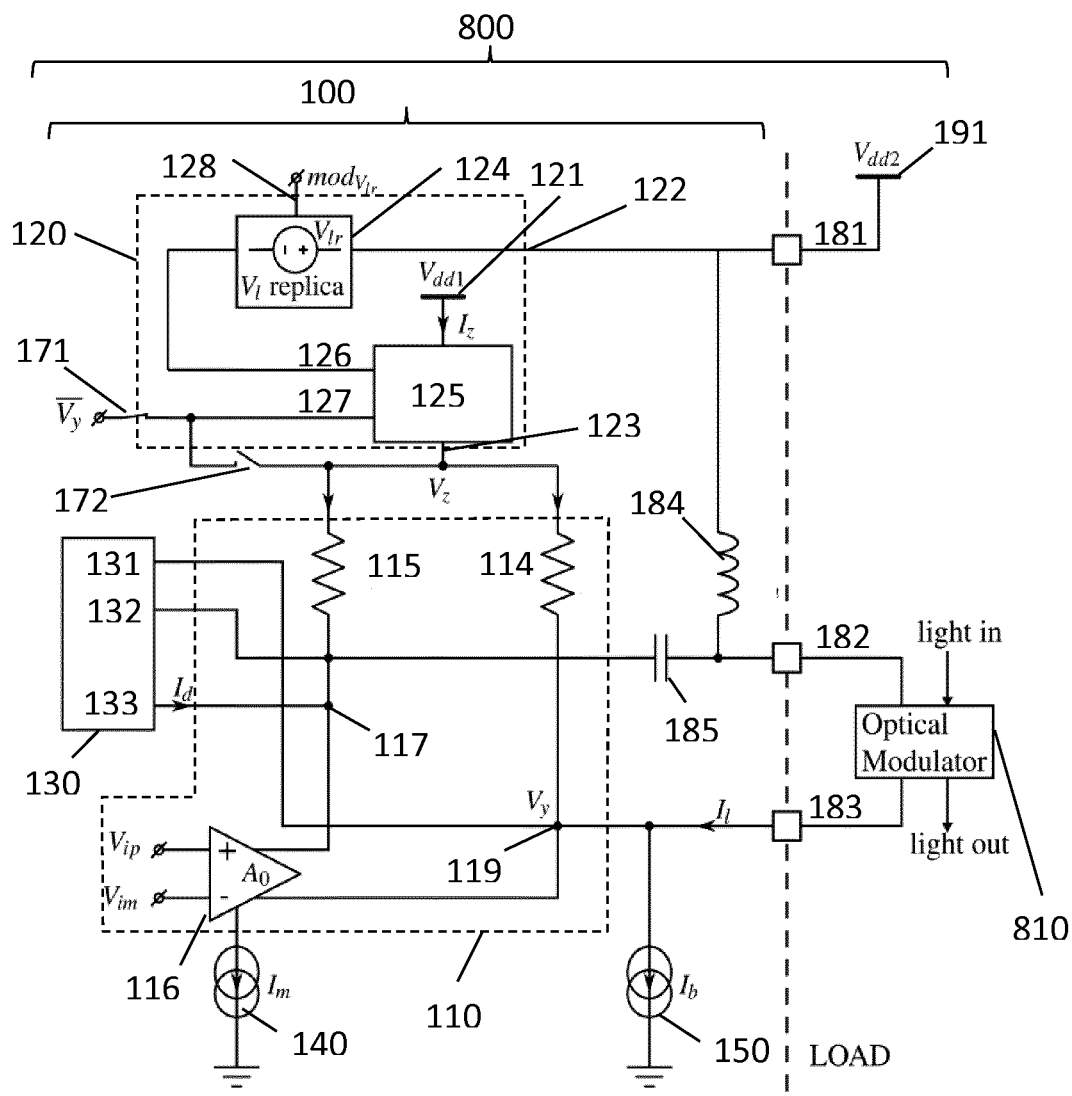
FIG. 13 shows a laser/modulator driver in accordance with embodiments of the present invention wherein the driver is configured and connected with a modulator for driving the modulator.
Figure 14:
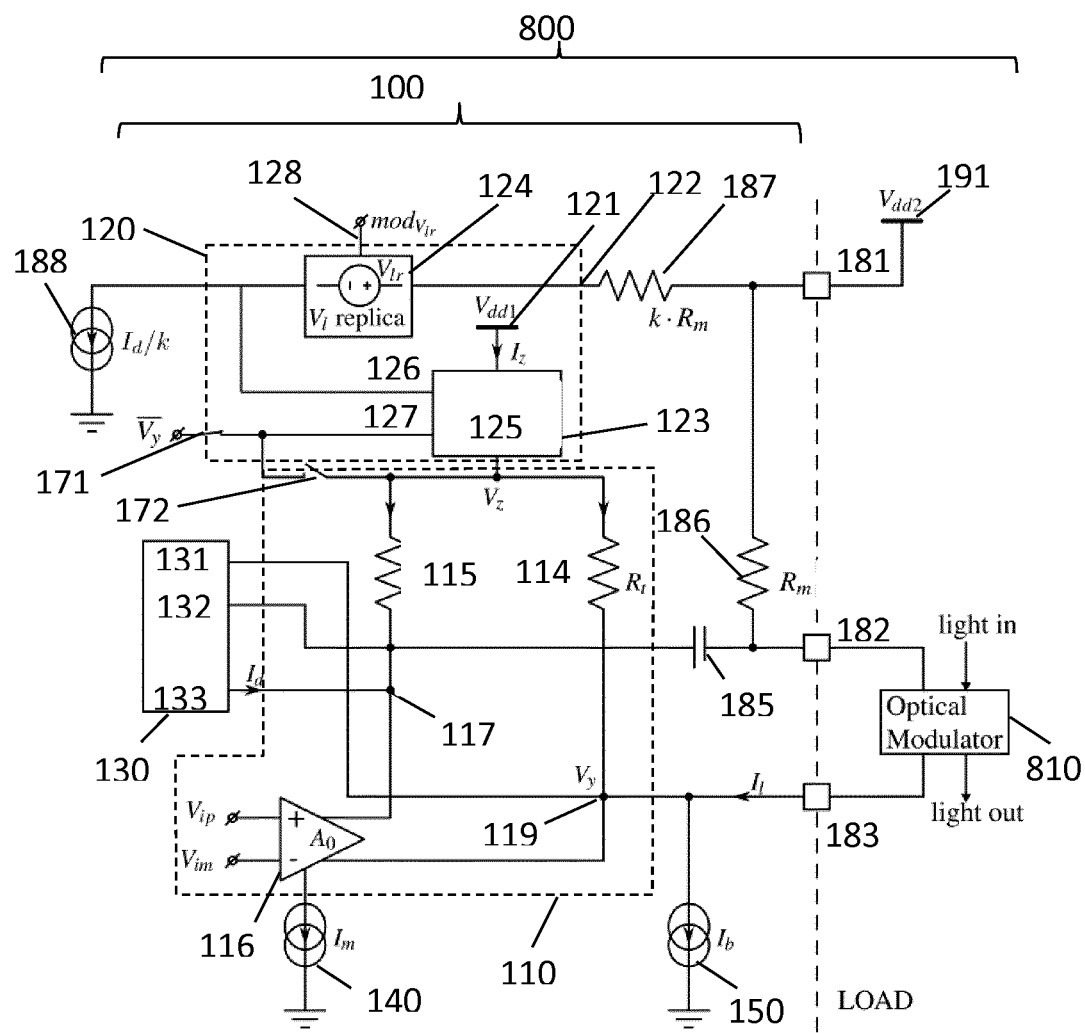
FIG. 14 shows an alternative configuration for driving a modulator in accordance with embodiments of the present invention.

FIGS. 12, 13, and 14 illustrate how a driver 100, in accordance with embodiments of the present invention, can be used and configured for driving a laser 195 or for driving a modulator 810. Driving different types of loads can for example be driven by connecting the load differently to the driver 100 and by switching a different feedback input to the voltage converter at the second input node 127.

Conceptually, it is possible to use the same circuit for both scenarios, as shown in FIGS. 12, 13 and 14 by making the DC voltages that are equalized in the driver configurable. This may for example be achieved using switches 171, 172.

In these examples the second input node 127 of the voltage converter block 125 (i.e. the feedback input) being either the voltage Vz at the common node 123 (when driving a laser) or the average of the voltage Vy at the current node 119 of the switch block 110 (when driving a modulator). Selecting a different input for the second input node may be achieved using a first switch 171 for selecting the average of the voltage Vy, and a second switch 172 for selecting the voltage Vz. The replica voltage also needs to be adapted representing either a laser forward threshold voltage or either a bias voltage of the modulator.

The driver may for example comprise bondpads for differently connecting an external load. In the examples of FIGS. 11, and 12 an inductor 184 is connected between the input port 122 of the voltage converter 120 and a capacitor 185. The capacitor 185 is connected with the second node 117 of the switch block 110. A first bondpad 181 corresponds with the input port 122 of the voltage converter 120. A second bondpad 182 is connected with the interconnection between the capacitor 185 and the inductor 184. A third bondpad 183 is connected with the current node 119 of the switch block. In FIG. 13 instead of an inductor 184, a resistor 186 is present between the first bondpad 181 and the second bondpad 182.

When driving a laser, the voltage converter 120 is adapted for equalizing the voltage at the input port 126 of the voltage converter block 125 with the voltage at the output port 123 by using the pre-defined voltage subtracted from the voltage at input port 122 wherein the pre-defined voltage approximates a threshold voltage of the laser. In that case the laser may be connected as illustrated in FIG. 12. The anode of the laser together with the load supply voltage Vdd2 is connected with the input port 122. This may be achieved by connecting the anode of the laser and the load supply voltage with the first bondpad 181. In the example the second bond pad 182 is left floating having the disadvantage of a less denser integration of laser drivers in a certain area. The cathode of the laser is connected with the current node 119 of the switch block 110. This may be achieved by connecting the cathode of the laser with the third bondpad 183.

In case of driving a modulator the voltage converter 120 is adapted for equalizing the voltage at the input port 126 of the voltage converter block 125 with the average voltage of current node 119, by using the pre-defined voltage subtracted from the voltage at input port 122 wherein the predefined voltage approximates a bias voltage of the modulator. In case of driving a modulator, the bias current Ib generated by the current source 150 is not necessary and can be disabled. The modulator 810 is on one side connected with the node connecting the inductor 184 and the capacitor 185, and is on the other side connected with the current node 119 of the switch block. In the example of FIG. 13 the modulator 810 is connected between the second bondpad 182 and the third bondpad 183 while the load supply voltage node 191 is connected with the first bondpad 181.

In embodiments of the present invention the driver comprises a laser or a modulator. In case of a laser, the laser is connected between the current node 119 and the supply voltage node 191 such that it is cathode driven. In case of driving a modulator differentially, the modulator is connected with the current node 119 and second node 117 and with the supply voltage node 191 through a bias tee. In case of driving a modulator single-endedly, the modulator is connected with the current node 119 and with the supply voltage node 191. In both cases the voltage converter 120 is adapted for equalizing DC voltages in the driver during operation of the driver 100 by using the pre-defined voltage.

The voltage converter 120 is mainly dealing with the accurate and stable biasing part. To pursue high data rates, the insertion of a balancer 130 is required.

In embodiments of the present invention the current through node 119 provided by current source 140 and/or current source 150 can be kept to a minimum to bias a laser or a modulator. In embodiments of the present invention the balancer sources a current into second node 117 in order to balance the load and improve high-speed performance.

These examples illustrate the way the driver can be connected to a load depending on the load type. The invention, however, is not limited to the configurations illustrated in FIG. 12 to FIG. 14. The circuitry may be optimized depending on the load. For example the modulation current Im generated by the modulation current source 140, the termination resistors 114, 115, the driver supply voltage Vdd1 at the voltage supply node 121 and load supply voltage Vdd2 at the voltage supply node 191 can greatly differ for a laser and a modulator.

FIG. 12 and FIG. 13 assume an LC-biasing scheme 184, 185 for the modulator 810, however, in some cases the area required by the inductor 184 is not feasible. An alternative therefore would be to use an RC bias tee between the load supply node 191 and the second node 117. Some optical modulators, e.g. an electro-absorption modulator, source a photon current $I_l$ depending on the intensity of the incoming light. The bias resistor 186 introduces then an undesired voltage drop resulting from the photon current, thereby affecting the bias voltage across the modulator. This issue is solved by the circuit in FIG. 14. In this exemplary embodiment of the present invention an accurate bias voltage independent of photon current is provided. A k-scaled copy 187 of the bias resistor 186 is connected in series with the replica voltage source 124. Current is drawn from the replica series connection with a k-scaled copy of the balance current Id, that under correct operation and assuming Ib is disabled, equals photon current $I_l$. In this example the k-scaled copy of the balance current Id is drawn by means of a current source 188.

FIG. 15 and FIG. 16 schematically illustrate another exemplary embodiment of the present invention wherein the driver is connected with a modulator for single-endedly driving the modulator.

In the example of FIG. 15 the driver corresponds with the driver illustrated in FIG. 5. In this example the modulator 810 is connected between the current node 119 and the supply voltage node 191.

In FIG. 16 the driver has the same configuration as the drivers in FIGS. 12 to 14 comprising the first 181, second 182 and third 183 bondpads. In FIG. 16 the modulator 810 is connected between the first 181 and third bondpad 183. The first bondpad is connected with the load supply voltage node 191.

The invention claimed is:

1. A driver for driving a laser or a modulator, the driver comprising:
   a switch block for switching a current to the laser or modulator, wherein the laser or modulator is connectable with a current node of the switch block so as to enable current flowing via the current node to the laser or the modulator,
   a voltage converter comprising a voltage supply node, an input port for connecting a laser or modulator supply voltage node and an output port connected to the switch block, the voltage converter comprising a voltage replica block which is adapted for generating a pre-defined voltage, wherein the voltage converter is adapted for equalizing DC voltages in the driver during operation of the driver by using the pre-defined voltage,
   wherein the pre-defined voltage approximates a threshold voltage of the laser or a preferred bias voltage over the modulator,
   a balancer comprising a dummy load connected to the switch block adapted for equalizing voltages in the switch block.

2. The driver according to claim 1, wherein the switch block comprises a differential stage and a corresponding first and second back termination resistor,
   wherein a first output pin of the differential stage is connected to one side of the first back termination resistor at the current node, and
   wherein a second output pin of the differential stage is connected to one side of the second back termination resistor at a second node, and wherein the other sides of both back termination resistors are electrically connected with a common node, and
   wherein the laser or modulator is connectable with the current node so as to enable current flowing via the current node through the differential stage.

3. The driver according to claim 1, wherein the voltage converter comprises a voltage converter block comprising a first input node, a second input node, said voltage supply node and said output port,
   wherein said output port is connected to the common node of the switch block,
   wherein the voltage replica block comprises said input port and an output port connected to the first input node of the voltage converter block and
   wherein the voltage converter block is adapted for equalizing the DC voltage at the first input node with the DC voltage at the second input node by controlling the output port.

4. The driver according to claim 3, wherein the second input node of the voltage converter block is connected with the common node of the switch block when the driver is adapted for driving a laser,
or wherein the second input node of the voltage converter block is adapted for obtaining the average voltage at the current node of the switch block when the driver is adapted for driving a modulator,
wherein the balancer is adapted for equalizing the voltages of the current node and of the second node of the switch block.

5. The driver according to claim 3, wherein the voltage converter block comprises a transistor and an operational amplifier, the operational amplifier comprising a first input node, a second input node, and an output,
   wherein the voltage replica block is connected on one side with the input port of the voltage converter and on the other side with the first input node of the operational amplifier,
   wherein the second input node of the operational amplifier is connected with the common node of the switch block in case the driver is adapted for driving a laser, or
   wherein the second input of the operational amplifier is adapted for obtaining the average voltage at the current node of the switch block in case the driver is adapted for driving a modulator,
   wherein the output of the operational amplifier is connected with the gate of the transistor of the voltage converter block, and
   wherein the transistor of the voltage converter block is connected to the voltage supply node on one side and to the common node of the switch block on the other side.

6. The driver according to claim 3, wherein the voltage converter block comprises an operational amplifier, a current source and a common-mode resistor,
   wherein the voltage replica block is connected on one side with the input port of the voltage converter and on the other side with the first input of the operational amplifier,
   wherein the second input of the operational amplifier is connected with the common node of the switch block in case the driver is adapted for driving a laser, or
   wherein the second input of the operational amplifier is adapted for obtaining the average voltage at the current node of the switch block in case the driver is adapted for driving a modulator,
   wherein the current source and the common-mode resistor are connected in series and the common-mode resistor is connected between the voltage supply node and the common node of the switch block and the current source between the common node and ground potential, and
   wherein the output of the operational amplifier is connected with the current source so as to control the current through the current source.

7. The driver according to claim 3 wherein the voltage converter block is a switch-mode power supply.

8. The driver according to claim 1 wherein the balancer comprises a first and a second input terminal and an output terminal adapted to source current,
   wherein the first input terminal is connected to current node of the switch block, and
   wherein the second input terminal is connected to second node of the switch block, and
   wherein the balancer is adapted to source a current via the output terminal, based on the voltage difference between the first input terminal and the second input terminal, to make the load symmetrical.

9. The driver according to claim 1, wherein the voltage replica block is adaptable to a plurality of pre-defined voltages.

10. An opto-electronics transmitter, the opto-electronics transmitter comprising a driver according to claim 1 and a laser, wherein the pre-defined voltage of the voltage replica block approximates the threshold voltage drop of the laser.

11. An opto-electronics transmitter, the opto-electronics transmitter comprising a driver according to claim 1 and a modulator,
   wherein the top terminal of the modulator is AC-coupled with the second node while also DC-coupled to the modulator supply voltage node and
   wherein the bottom terminal of the modulator is connected with the current node of the switch block,
   wherein during operation the pre-defined voltage sets the bias voltage of the modulator.

\* \* \* \* \*